United States Patent
Tandai et al.

(10) Patent No.: US 8,958,758 B2
(45) Date of Patent: Feb. 17, 2015

(54) COMMUNICATION APPARATUS PERFORMING AUTOMATIC GAIN CONTROL AND FIELD LENGTH SELECTION FOR A COMMUNICATION FRAME

(75) Inventors: Tomoya Tandai, Kawasaki (JP); Kentaro Taniguchi, Yokohama (JP); Ryoko Matsuo, Tokyo (JP); Takeshi Tomizawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 322 days.

(21) Appl. No.: 13/339,893

(22) Filed: Dec. 29, 2011

(65) Prior Publication Data

US 2012/0100816 A1    Apr. 26, 2012

Related U.S. Application Data

(63) Continuation of application No. PCT/JP2009/003019, filed on Jun. 30, 2009.

(51) Int. Cl.
*H04B 1/06* (2006.01)
*H04B 7/00* (2006.01)
(Continued)

(52) U.S. Cl.
CPC ......... *H03G 3/3078* (2013.01); *H04B 17/0045* (2013.01); *H04W 52/52* (2013.01)
USPC .......... 455/69; 455/136; 455/138; 455/232.1; 455/245.1; 455/250.1

(58) Field of Classification Search
CPC .. H03G 3/3078; H04B 17/0045; H04W 52/52
See application file for complete search history.

(56) References Cited

U.S. PATENT DOCUMENTS

| | | | |
|---|---|---|---|
| 6,084,905 A * | 7/2000 | Ishifuji et al. | 375/133 |
| 2004/0048592 A1 | 3/2004 | Yamanaka | |

(Continued)

FOREIGN PATENT DOCUMENTS

| | | |
|---|---|---|
| JP | 7-143301 A | 6/1995 |
| JP | 2004-104321 A | 4/2004 |

(Continued)

OTHER PUBLICATIONS

International Search Report and Written Opinion dated Oct. 20, 2009 (in English) in counterpart International Application No. PCT/JP2009/003019.

*Primary Examiner* — Yuwen Pan
*Assistant Examiner* — Fanghwa Wang
(74) *Attorney, Agent, or Firm* — Holtz, Holtz, Goodman & Chick PC

(57) ABSTRACT

According to one exemplary embodiment, a communication apparatus includes: a measurement module which measures reception power of each field; a determination module which determines whether the reception power is within a range; a calculator which calculates a gain using the reception power if the reception power is not within the range; an adjuster which adjusts a field according to one of an initial gain and the calculated gain; a selector which selects a field length according to the number of field adjustments by the adjuster; and a transmitter which transmits information regarding the field length. When the number of the adjustments is lower than a first threshold value, the selector selects a first value, and when the number of the adjustments is equal to or higher than the first threshold value, the selector selects a second value that is higher than the first value, as the field length.

6 Claims, 15 Drawing Sheets

(51) Int. Cl.
*H03G 3/30* (2006.01)
*H04B 17/00* (2006.01)
*H04W 52/52* (2009.01)

(56) References Cited

U.S. PATENT DOCUMENTS

2005/0163088 A1 7/2005 Yamano et al.
2005/0227645 A1 10/2005 Sudo
2007/0268986 A1* 11/2007 Morita .......................... 375/295
2009/0135960 A1* 5/2009 Yotsumoto .................... 375/340

FOREIGN PATENT DOCUMENTS

| JP | 2004-159248 A | 6/2004 |
| JP | 2005-217548 A | 8/2005 |
| JP | 2007-208442 A | 8/2007 |
| JP | 2007-306474 A | 11/2007 |
| JP | 2008-136132 A | 6/2008 |
| JP | 2009-49694 A | 3/2009 |

* cited by examiner

0: AGC FIELD LENGTH HAVING THREE SYMBOLS
1: AGC FIELD LENGTH HAVING SINGLE SYMBOL

COMMUNICATION APPARATUS PERFORMING AUTOMATIC GAIN CONTROL AND FIELD LENGTH SELECTION FOR A COMMUNICATION FRAME

CROSS REFERENCE TO RELATED APPLICATION(S)

This is a Continuation Application of PCT Application No. PCT/JP2009/003019 filed on Jun. 30, 2009, which was published under PCT Article 21(2) in Japanese; the entire contents of which are incorporated herein by reference.

FIELD

Embodiments described herein relate generally to wireless communication.

BACKGROUND

There is a related art in which a transmitting side communication apparatus receives, from a receiving side apparatus, notification of a frame format decided in accordance with a frame reception status or the like, and changes the frame format.

However, in the related art, even when a broad band (e.g., a millimeter waveband of 30 GHz to 300 GHz) is used, a time required for automatic gain control (AGC), which is processing performed by an analog circuit, cannot be sufficiently reduced as compared with a communication time of a data portion.

When a field for automatic gain control is too long, an increase in overhead (time required for automatic gain control) is provoked, and when the field for automatic gain control is too short, automatic gain control cannot be sufficiently carried out at the receiving side apparatus, resulting in degradation in reception performance.

BRIEF DESCRIPTION OF THE DRAWINGS

Exemplary embodiments of the present invention will be described in detail based on the following figures, wherein.

DETAILED DESCRIPTION OF THE EXEMPLARY EMBODIMENTS

According to one embodiment, a communication apparatus for receiving, from another communication apparatus, a frame having a plurality of fields for power adjustment, the apparatus includes: a measurement module configured to measure average reception power of each field; a determination module configured to determine whether or not a measurement result obtained by the measurement module falls within a given range; a calculator configured to calculate a gain using the measurement result when it is determined that the measurement result does not fall within the given range; an adjuster configured to adjust each field according to one of an initial gain and the calculated gain; a selector configured to select a field length according to the number of field adjustments made by the adjuster during a period between start of reception of the frame and the determination by the determination module that the measurement result has fallen within the given range; and a transmitter configured to transmit, to the other communication apparatus, information about the field length, wherein when the number of the adjustments is lower than a first threshold value, the selector is configured to select, as the field length, a first value, and when the number of the adjustments is equal to or higher than the first threshold value, the selector is configured to select, as the field length, a second value that is higher than the first value.

Hereinafter, embodiments will be described.

First Embodiment

Figure 1:
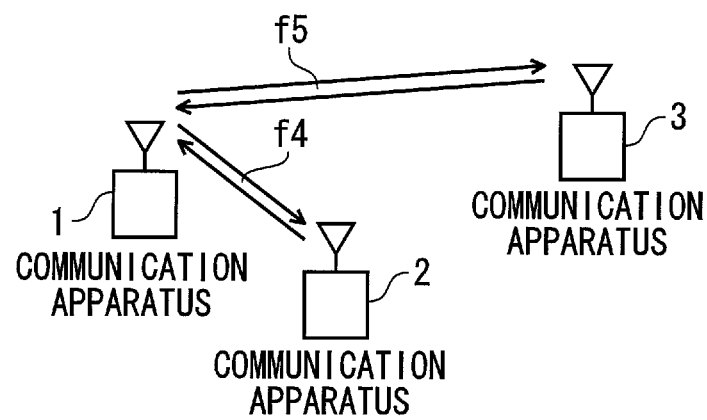
FIG. 1 is a diagram showing a wireless communication system.

FIG. 1 is a diagram showing a wireless communication system according to a first embodiment. Communication apparatuses 1 to 3 wirelessly communicate with each other by using a millimeter waveband or the like. The range of arrival of radio waves exchanged between the communication apparatuses 1 to 3 is narrow. When the communication apparatuses 1 and 2 are brought close to each other, communication between the communication apparatuses 1 and 2 is enabled. When the communication apparatuses 1 and 3 are brought close to each other, communication between the communication apparatuses 1 and 3 is enabled.

The communication apparatus 1 connects with the communication apparatus 2, exchanges a series of frames f4, and performs a disconnecting process. Then, the communication apparatus 1 connects with the communication apparatus 3, exchanges a series of frames f5, and performs a disconnecting process. In this manner, each of the communication apparatuses 1 to 3 ends the communication with the single communication apparatus, and then communicates with the other single communication apparatus.

Figure 2:
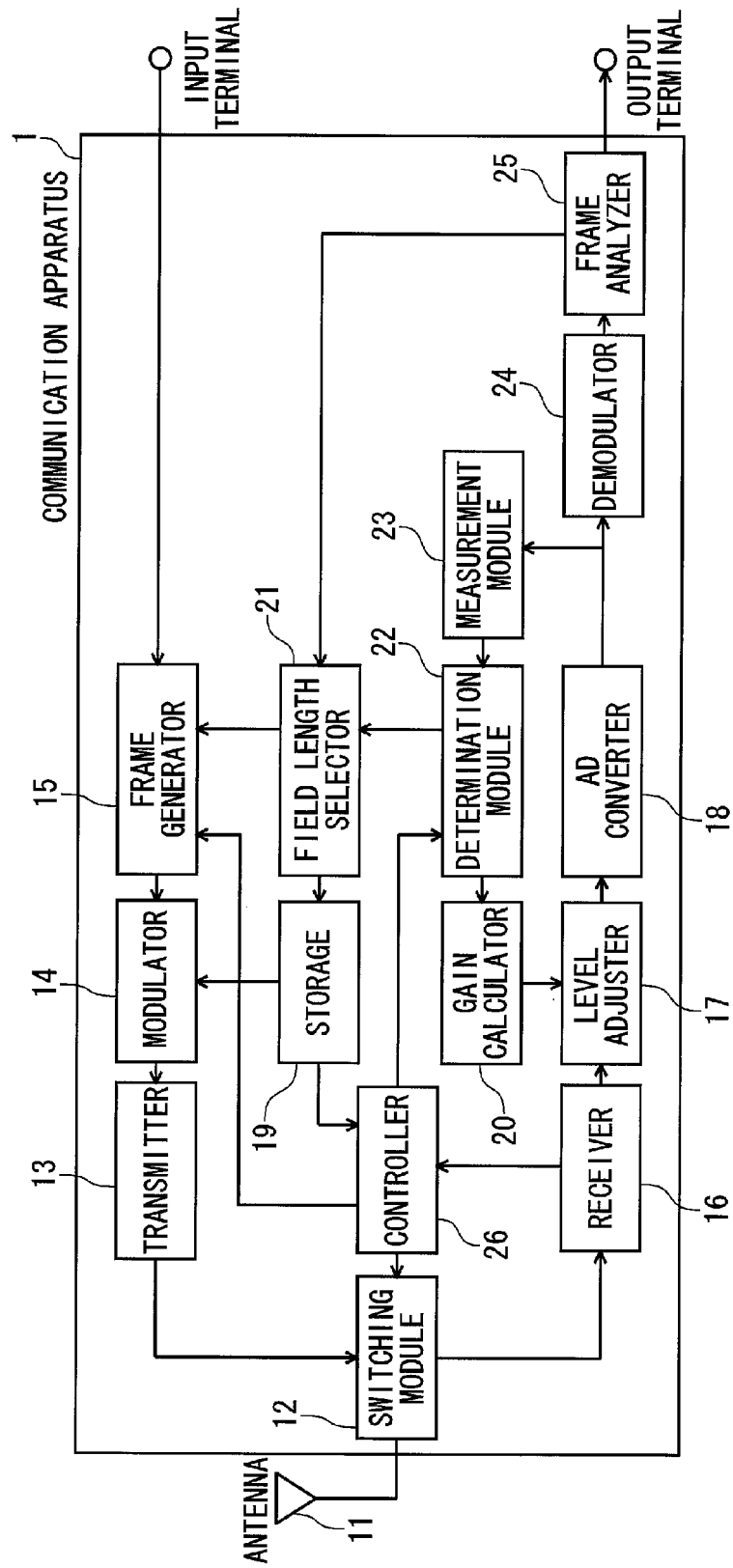
FIG. 2 is a diagram showing a wireless apparatus.

FIG. 2 is a diagram showing a configuration of the communication apparatus 1. Note that a configuration of each of the communication apparatuses 2 and 3 is similar to that of the communication apparatus 1. The communication apparatus 1 includes: an antenna 11; a switching module 12; a transmitter 13; a modulator 14; a frame generator 15; a receiver 16; a level adjuster 17; an AD converter 18; a storage 19; a gain calculator 20; a field length selector 21; a determination module 22; a measurement module 23; a demodulator 24; a frame analyzer 25; and a controller 26. The frame generator 15 and the frame analyzer 25 communicate with a higher layer via an input terminal and an output terminal, respectively.

Figure 3:
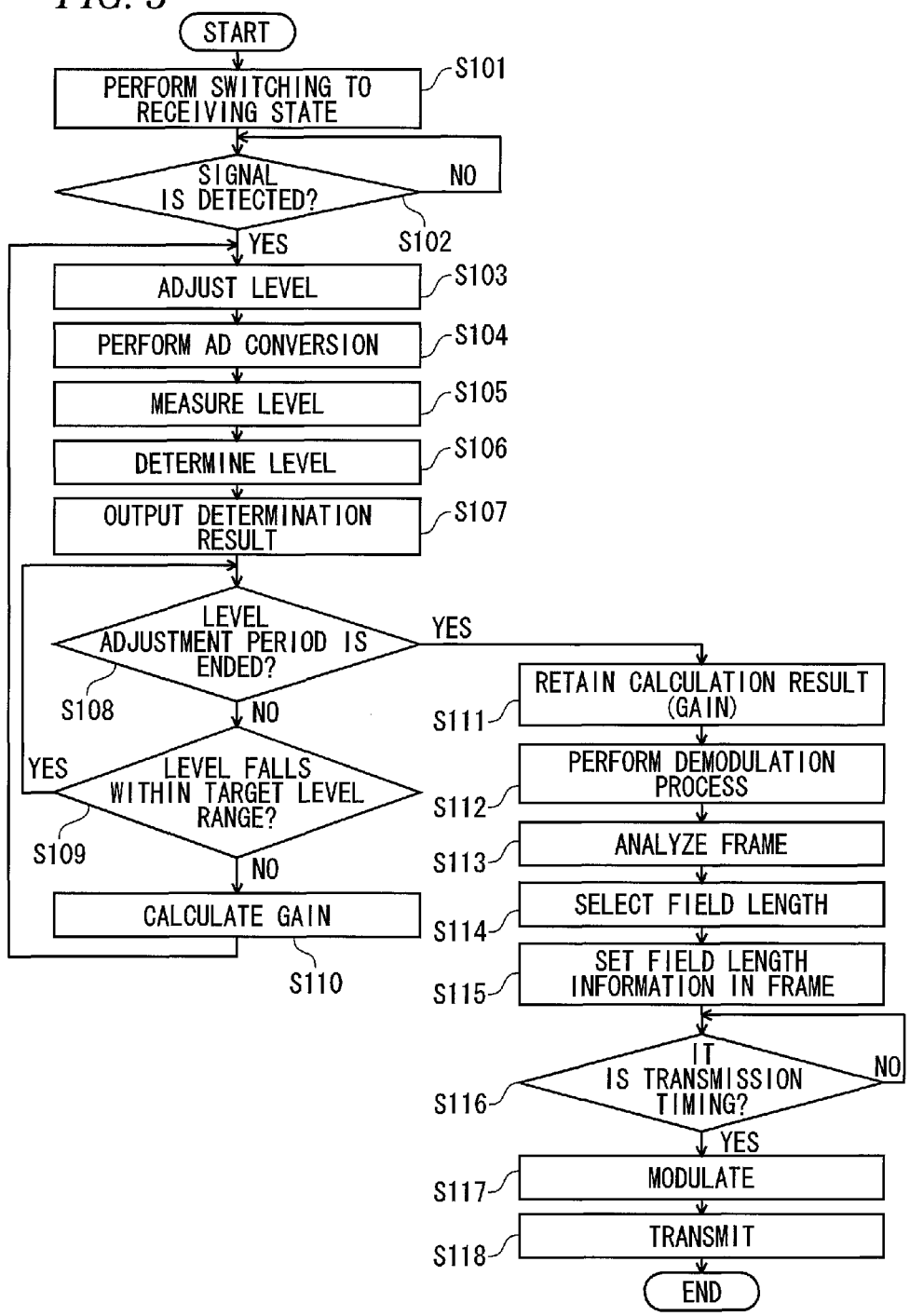
FIG. 3 is a flow chart showing operations of a communication apparatus.
Figure 4:
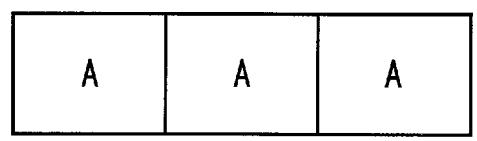
FIG. 4 is a diagram showing AGC fields.

FIG. 3 is a flow chart showing operations of the communication apparatus 1. The communication apparatus 1 receives, from the communication apparatus 2, a reception signal (frame) having a plurality of fields (hereinafter referred to as "AGC fields") for power adjustment (AGC: Automatic Gain Control). FIG. 4 is a diagram showing exemplary AGC fields of the frame received by the communication apparatus 1. The frame received by the communication apparatus 1 has three AGC fields A, for example.

First, the controller 26 controls the switching module 12 to perform switching to a receiving state, i.e., a standby state (at Step S101). Next, the receiver 16 performs a signal detection process to determine whether or not the signal is detected (at Step S102). When no signal is detected ("No" at Step S102), the receiver 16 continues the receiving state. When the signal is detected by the receiver 16 ("Yes" at Step S102), the level adjuster 17 adjusts the level of the reception signal by using an initial gain value G1 stored in an internal memory (not shown) of the gain calculator 20, or amplifies the level of the reception signal in accordance with the initial gain value G1 (at Step S103). Subsequently, the AD converter 18 converts the adjusted reception signal, which is an analog signal, into a digital signal (at Step S104). Then, the measurement module 23 measures the level (average reception power) of the digital signal, i.e., the reception signal (at Step S105).

Next, the determination module 22 determines whether or not the level measured by the measurement module 23 has fallen within the range of a given target level, which is equal to or higher than a first threshold value and lower than a second threshold value (at Step S106). Subsequently, the determination module 22 outputs a determination result to the field length selector 21 (at Step S107). Then, the determination module 22 receives, from the controller 26, information about whether or not a period (hereinafter referred to as a "level adjustment period"), which is included in a frame reception period and during which the AGC field(s) is/are received, has ended.

When the level adjustment period has not ended ("No" at Step S108) and the level measured by the measurement module 23 falls outside the range of the given target level ("No" at Step S109), the gain calculator 20 calculates a new gain based on the measured level of the digital signal by the measurement module 23, and then the process of Step S103 and the subsequent processes are repeated.

On the other hand, when the level adjustment period has ended ("Yes" at Step S108), the gain used in the last level adjustment (at Step S103) is stored in the internal memory of the gain calculator 20 in order to use the gain as the initial gain value at the time of the next reception (at Step S111). Then, the demodulator 24 performs a demodulation process on the digital signal, i.e., the reception signal (at Step S112). Next, the frame analyzer 25 performs analysis on the frame, i.e., the demodulation result (at Step S113).

Then, the field length selector 21 selects an AGC field length in accordance with the number of adjustments made on the level of the reception signal by the level adjuster 17 (hereinafter referred to as the "number of level adjustments") during a period between the start of the frame reception and the determination that the level measured by the measurement module 23 has fallen within the range of the given target level (at Step S114). Next, the field length selector 21 outputs a selection result of the AGC field length to the frame generator 15. The AGC field length may be the number of the AGC fields included in the frame, may be the length (byte length or time length) of each AGC field, or may be a combination thereof.

Subsequently, the frame generator 15 sets AGC field length information in a transmission frame, e.g., a data frame or an acknowledgement frame (at Step S115). Then, the frame generator 15 receives, from the controller 26, information about whether or not a transmission right is acquired in accordance with a carrier sense result or the like obtained by the receiver 16, and determines whether or not it is the timing for frame transmission (at Step S116). When it is not the timing for frame transmission, the operation is put on standby until the timing for frame transmission comes. When it is the timing for frame transmission, the modulator 14 modulates the frame (at Step S117), and the transmitter 13 transmits the modulated frame to the communication apparatus 2 via the switching module 12 and the antenna 11 (at Step S118).

Figure 5:
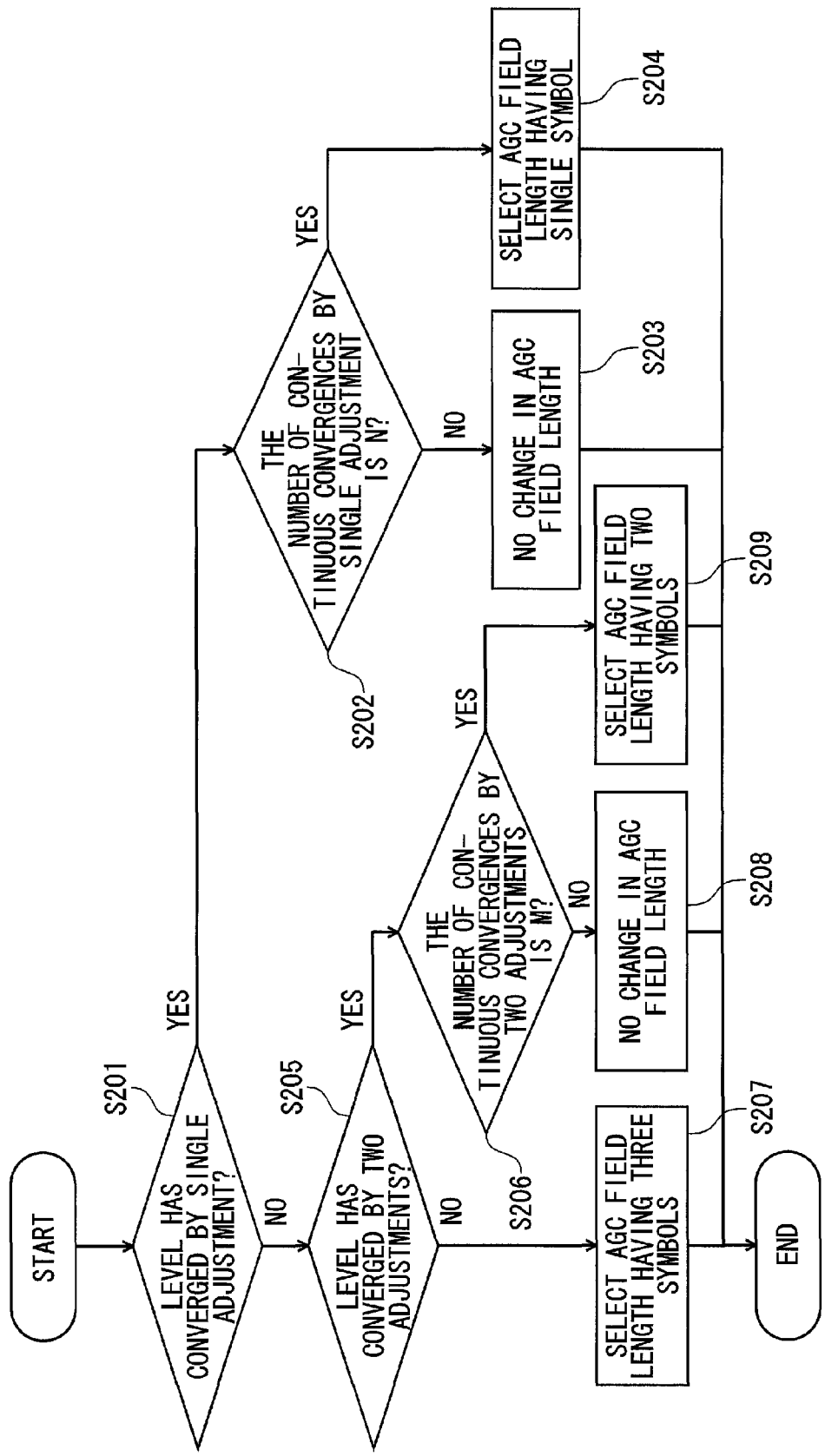
FIG. 5 is a flow chart showing operations of a field length selector.

FIG. 5 is a flow chart showing operations of the field length selector 21 (i.e., details of Step S114 in FIG. 3). First, the field length selector 21 determines whether or not the measured level has converged to the target level by a single level adjustment (at Step S201). When the measured level has converged to the target level by the single level adjustment ("Yes" at Step S201), the field length selector 21 determines whether or not the number of times the measured level has continuously converged to the target level (i.e., the number of continuous convergences) by the single level adjustment is equal to or higher than a given number N where N denotes an integer of one or more (at Step S202). When the number of continuous convergences by the single level adjustment is equal to or higher than the number N ("Yes" at Step S202), the field length selector 21 selects the AGC field length having a single symbol, i.e., the AGC field length having the single AGC field (at Step S204). When the number of continuous convergences by the single level adjustment is less than the number N ("No" at Step S202), the field length selector 21 does not change the AGC field length (at Step S203).

On the other hand, when the measured level has not converged to the target level by the single level adjustment ("No" at Step S201), the field length selector 21 determines whether or not the measured level has converged to the target level by two level adjustments (at Step S205). When the measured level has converged to the target level by the two level adjustments ("Yes" at Step S205), the field length selector 21 determines whether or not the number of times the measured level has continuously converged to the target level (i.e., the number of continuous convergences) by the two level adjustments is equal to or higher than a given number M (at Step S206). When the number of continuous convergences by the two level adjustments is equal to or higher than the number M where M denotes an integer of one or more ("Yes" at Step S206), the field length selector 21 selects the AGC field length having two symbols, i.e., the AGC field length having two AGC fields (at Step S209). When the number of continuous convergences by the two level adjustments is less than the number M ("No" at Step S206), the field length selector 21 does not change the number of the AGC fields (at Step S208).

On the other hand, when the measured level has not converged to the target level by the two level adjustments ("No" at Step S205), the field length selector 21 selects the AGC field length having three symbols, i.e., the AGC field length having three AGC fields (at Step S207).

Next, operations of the communication apparatus 2 will be described. The communication apparatus 2 receives, from the communication apparatus 1, a frame (e.g., a data frame or an acknowledgement frame) in which AGC field length information is set. Frame reception and a demodulation process performed by the communication apparatus 2 are similar to those performed in Steps S101 to S112 shown in FIG. 3. Then, the frame analyzer 25 analyzes the frame received from the communication apparatus 1, and extracts the AGC field length information. Subsequently, the frame analyzer 25 outputs the extracted AGC field length information to the field length selector 21. Next, the field length selector 21 writes the AGC field length information in the storage 19. Thereafter, a data transmission request is issued to the communication apparatus 2, and the communication apparatus 2 acquires a transmission right; then, the frame generator 15 adds AGC field(s) to a transmission frame in accordance with the AGC field length information stored in the storage 19. Next, the modulator 14 performs a modulation process on the transmission frame to which the AGC field(s) has/have been added. Subsequently, the transmitter 13 transmits the modulated transmission signal via the switching module 12 and the antenna 11.

Figure 6:
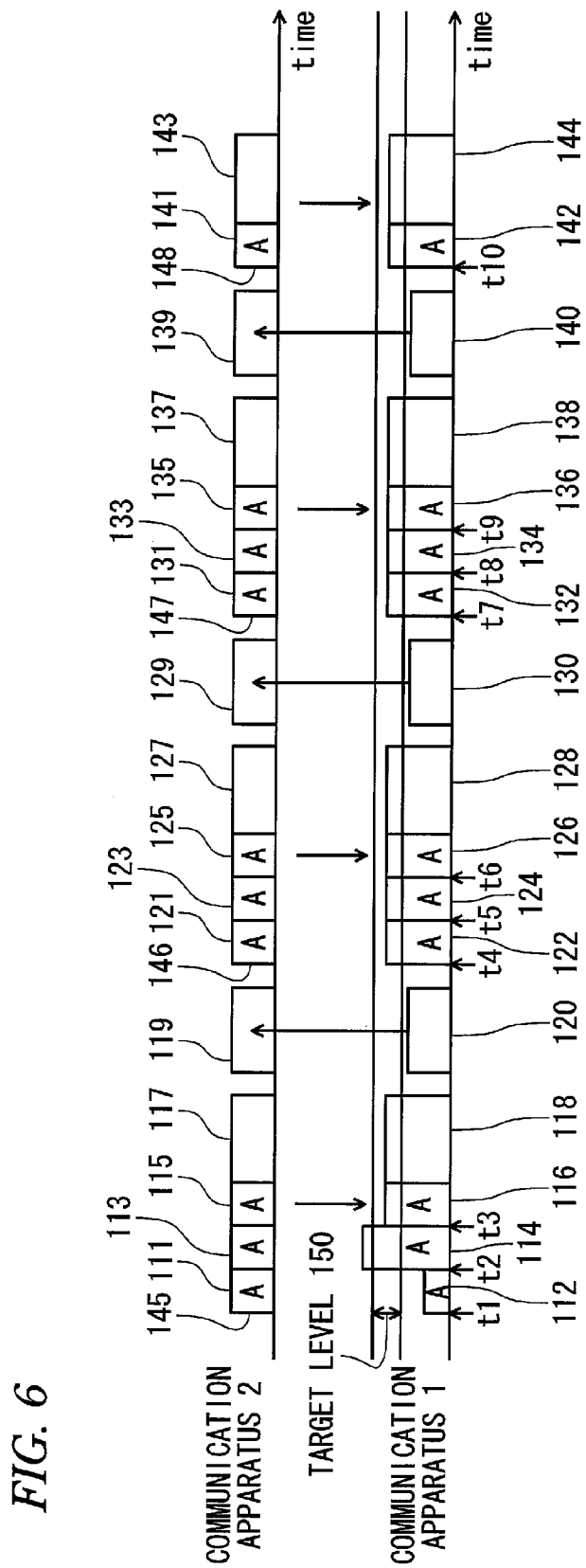
FIG. 6 is a timing chart showing sequences between communication apparatuses.

FIG. 6 is a timing chart showing frame exchange sequences between the communication apparatus 1 and the communication apparatus 2. First, the communication apparatus 2 transmits, to the communication apparatus 1, a frame 145 having three AGC fields 111, 113 and 115 and a frame body 117. The communication apparatus 1 performs a level adjustment by the initial gain G1 at a time point t1, and obtains a first AGC field 112 on which the level adjustment has been performed. Then, the communication apparatus 1 performs a level measurement on the pilot signal 112 on which the level adjustment has been performed, and calculates a gain G2 based on a result of the level measurement. Subsequently, the communication apparatus 1 performs a level adjustment by the gain G2 at a time point t2, and obtains a pilot signal 114 on which the level adjustment has been performed. Next, the communication apparatus 1 performs a level measurement on the pilot signal 114 on which the level adjustment has been performed, and calculates a gain G3 based on a result of the level measurement. Then, the communication apparatus 1 performs a level adjustment by the gain G3 at a time point t3, and obtains a third AGC field 116. Subsequently, the communication apparatus 1 performs a level measurement on the pilot signal 116 on which the level adjustment has been performed. Next, the communication apparatus 1 confirms that the level measurement result falls within the range of a target level 150, and then performs gain control on a frame body 118 by the gain G3. Further, the communication apparatus 1 retains this gain G3 as an initial gain for a next frame to be received.

Next, after having received the frame 145, the communication apparatus 1 transmits a response frame 120 (e.g., an acknowledgement frame). The communication apparatus 2 receives a response frame 119. After having received the response frame 119, the communication apparatus 2 transmits, to the communication apparatus 1, a frame 146 having three AGC fields 121, 123 and 125 and a frame body 127.

Subsequently, the communication apparatus 1 performs a level adjustment by the initial gain G3 at a time point t4, and obtains a first pilot signal 122 on which the level adjustment has been performed. Thereafter, the communication apparatus 1 performs a level measurement on the pilot signal 122 on which the level adjustment has been performed, and confirms that the measured level falls within the range of the target level 150. Then, the communication apparatus 1 stores data indicating that the measured level has fallen within the range of the target level by the single level adjustment. Subsequently, the communication apparatus 1 performs a level adjustment on each of pilot sequences 124 and 126 and a frame body 128 by the gain G3. Further, the communication apparatus 1 retains this gain G3 as an initial gain for a next frame to be received.

Next, after having received the frame 146, the communication apparatus 1 transmits a response frame 130. The communication apparatus 2 receives a response frame 129. After having received the response frame 129, the communication apparatus 2 transmits, to the communication apparatus 1, a frame 147 having three AGC fields 131, 133 and 135 and a frame body 137.

Subsequently, the communication apparatus 1 performs a level adjustment by the initial gain G3 at a time point t7, and obtains a first AGC field 132 on which the level adjustment has been performed. Thereafter, the communication apparatus 1 performs a level measurement on the pilot signal 132 on which the level adjustment has been performed, and confirms that the measured level falls within the range of the target level 150. The communication apparatus 1 stores data indicating that the two frames, each falling within the range of the target level by the single level adjustment, are continuously received, and performs a level adjustment on each of pilot sequences 134 and 136 and a frame body 138 by the gain G3. Further, the communication apparatus 1 retains this gain G3 as an initial gain for a next frame to be received.

Example where N=2 in the Processing of FIG. 5

The communication apparatus 1 has continuously received the two frames, each falling within the range of the target level by the single level adjustment; therefore, the communication apparatus 1 sets AGC field length information "single" in a response frame 140, and transmits the response frame 140 to the communication apparatus 2. Then, the communication apparatus 2 receives a response frame 139, and extracts the AGC field length information "single symbol (single)". Subsequently, after having received the response frame 139, the communication apparatus 2 transmits, to the communication apparatus 1, a frame 148 having a single AGC field 141 and a frame body 143.

Next, the communication apparatus 1 performs a level adjustment by the initial gain G3 at a time point t10, and obtains a first pilot signal 142 on which the level adjustment has been performed. The communication apparatus 1 performs a level measurement on the pilot signal 142 on which the level adjustment has been performed, and confirms that the measured level falls within the range of the target level 150. Then, the communication apparatus 1 performs a level adjustment on a frame body 144 by the gain G3.

As described above, an optimal AGC field length can be selected in accordance with stability of a reception signal level, thus making it possible to reduce the time required for AGC at the receiving side apparatus while suppressing risk of failure of frame reception, and to improve wireless communication efficiency and throughput.

Variation 1

In the foregoing first embodiment, the field length selector 21 may further perform operations in consideration of whether or not the current communication type is data transmission. In Variation 1 of the first embodiment, the field length selector 21 can determine, in response to command information provided from outside, whether or not the current communication type is data transmission.

When the current communication type is data transmission, the field length selector 21 performs processes similar to those of Steps S114 and S115 of FIG. 3.

On the other hand, when the current communication type is not data transmission, the field length selector 21 does not perform the processes of Steps S114 and S115 of FIG. 3. When the current communication type is not data transmission, a management frame for connection management or the like is generated by the frame generator 15 instead of performing the processes of Steps S114 and S115 of FIG. 3 by the field length selector 21. Examples of the management frame include a connection request frame, a connection response frame and a disconnection frame, which may be used, for example, for a request for connection of one communication apparatus with another communication apparatus, a response for a connection request, and disconnection for an already-established connection, respectively.

Then, the communication apparatus 1 transmits the management frame to the communication apparatus 2 through Steps S116 to S118 of FIG. 3.

Thus, an optimal AGC field length can be selected in accordance with the communication state type in addition to the stability of the reception signal level, thus making it possible to more reliably improve wireless communication efficiency and throughput.

Variation 2

In the first embodiment or Variation 1 thereof, the field length selector 21 may further perform operations in consideration of a frame reception interval. In Variation 2 of the first embodiment, the field length selector 21 can obtain a frame reception interval (i.e., an interval between a time point at which reception of a frame is started or completed and a time point at which reception of a next frame is started, or an interval between a time point at which transmission of a frame is started or completed and a time point at which reception of a next frame is started) from information provided from the controller 26 and indicating whether or not frame reception or transmission is performed, and information provided from a timer (not shown) and indicative of an elapsed time.

When a reception interval between an immediately previously received frame and a subsequently received frame is equal to or less than a given time interval T0, the field length selector 21 performs processes similar to those performed in Steps S114 and S115 in FIG. 3.

On the other hand, when the reception time interval between a plurality of frames is greater than the given time interval T0, the field length selector 21 resets the number of continuous convergences counted in Steps S202 and S206 of FIG. 5 (or initializes the number of continuous convergences to "0"), and then performs the processes of Steps S114 and S115 of FIG. 3.

As described above, when an elapsed time between reception of an immediately previously received frame and reception of a next frame is equal to or greater than a given time period, the number of continuous convergences is reset, thus making it possible to precisely measure the stability of the reception signal level.

Note that in Variation 2, a frame having a long AGC field length (FIG. 7 or FIG. 9) includes three symbols (i.e., three AGC fields), and a frame having a short AGC field length (FIG. 8 or FIG. 10) includes a single symbol (i.e., a single AGC field); however, the AGC field length and the number of AGC fields are not limited to those mentioned above.

Variation 3

Figure 7:
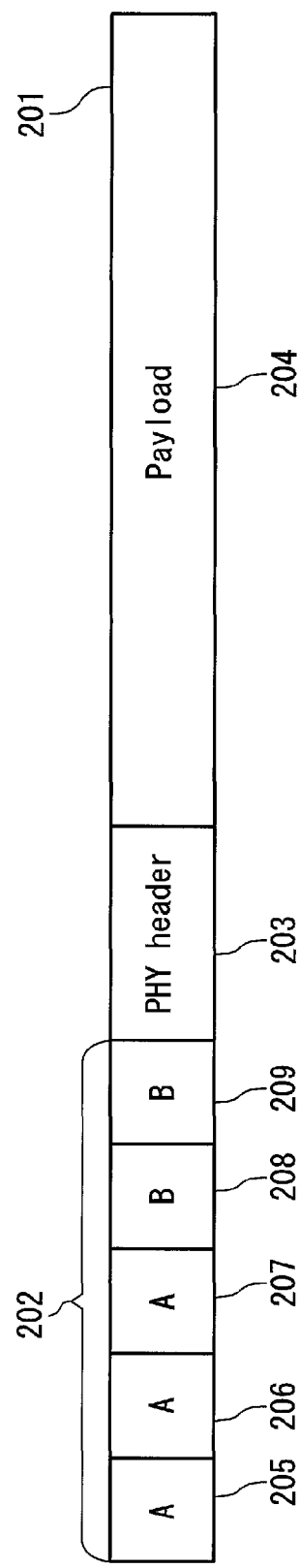
FIG. 7 is a diagram showing a frame.

A frame 201 shown in FIG. 7 has a preamble 202, a PHY Header 203, and a Payload 204. The preamble 202 has: three AGC fields (i.e., three symbols) 205, 206 and 207 (each of which is an automatic gain control signal sequence A); and two pilot signals 208 and 209 (each of which is a temporal synchronization and transmission path estimation signal sequence B). The PHY Header 203 includes information on the frame 201, such as a frame modulation method and the length of the Payload 204. The Payload 204 includes data. The receiving side communication apparatus may perform AGC by using the first and second AGC fields 205 and 206, may perform frequency synchronization by using the third AGC field 207, and may perform temporal synchronization and transmission path estimation by using the pilot signals 208 and 209.

Figure 8:
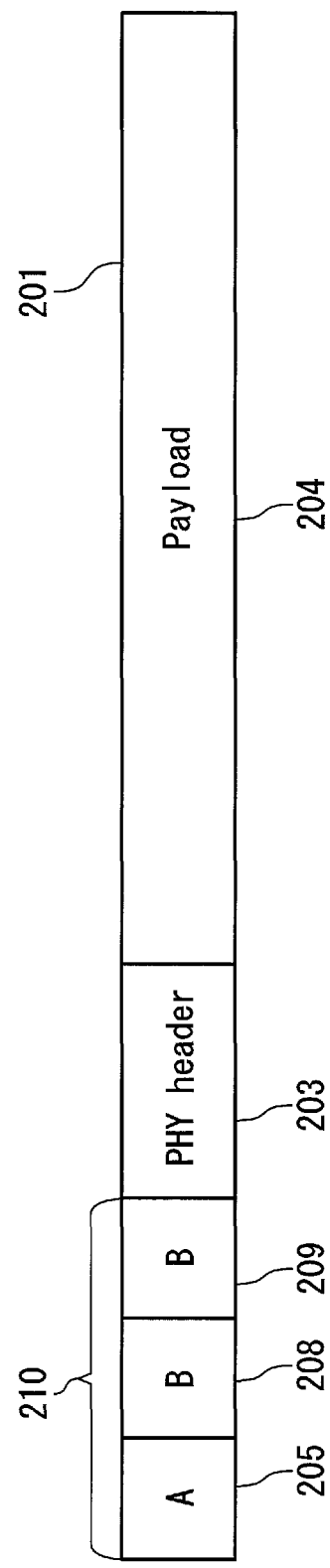
FIG. 8 is a diagram showing a frame.

A frame 201 shown in FIG. 8 has a preamble 210, a PHY Header 203, and a Payload 204. The preamble 210 has: a single AGC field (i.e., a single symbol) 205; and two pilot signals 208 and 209. The receiving side communication apparatus performs AGC and frequency synchronization by using the first AGC field 205.

Using the frame 201 shown in FIG. 7 or FIG. 8, the AGC field length (or the number of AGC fields) is dynamically changed as described above, thus making it possible to optimally select the time length of the preamble 202 or 510 and to improve wireless communication efficiency and throughput.

Figure 9:
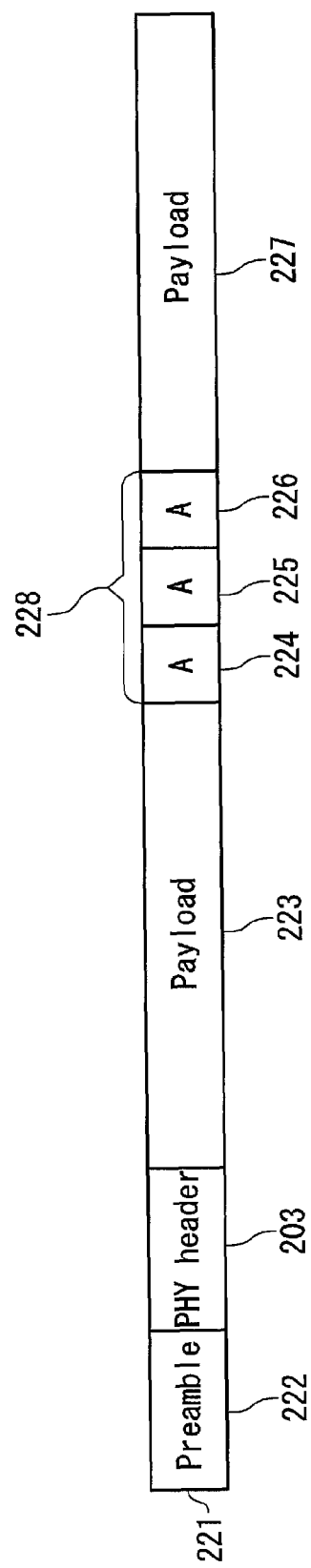
FIG. 9 is a diagram showing a frame.

A frame 221 shown in FIG. 9 has a preamble 222, a PHY Header 203, a midamble 228, and Payloads 223 and 227. The midamble 228 has three AGC fields (i.e., three symbols).

Figure 10:
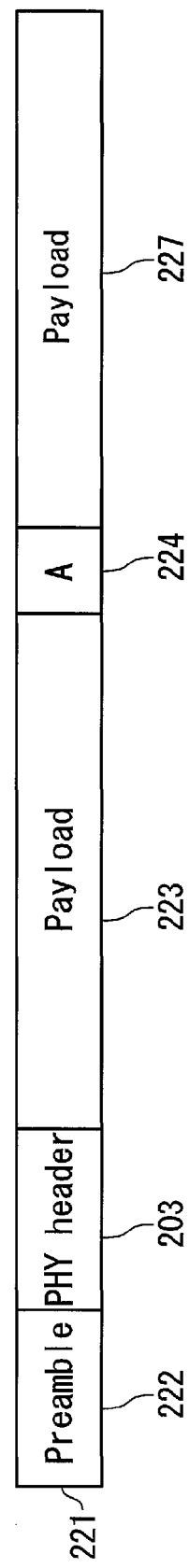
FIG. 10 is a diagram showing a frame.

A frame 221 shown in FIG. 10 has a preamble 222, a PHY Header 203, a midamble 224, and Payloads 223 and 227. The midamble 224 has a single AGC field (i.e., a single symbol).

The receiving side communication apparatus performs processes such as AGC, frequency synchronization, temporal synchronization and transmission path estimation by using the preamble 222, and performs a process such as AGC again by using the midamble 224 or 228.

Using the frame 221 shown in FIG. 9 or FIG. 10, the AGC field length (or the number of AGC fields) is dynamically changed as described above, thus making it possible to optimally select the time length of the midamble 224 or 228, and to improve wireless communication efficiency and throughput.

Figure 11:
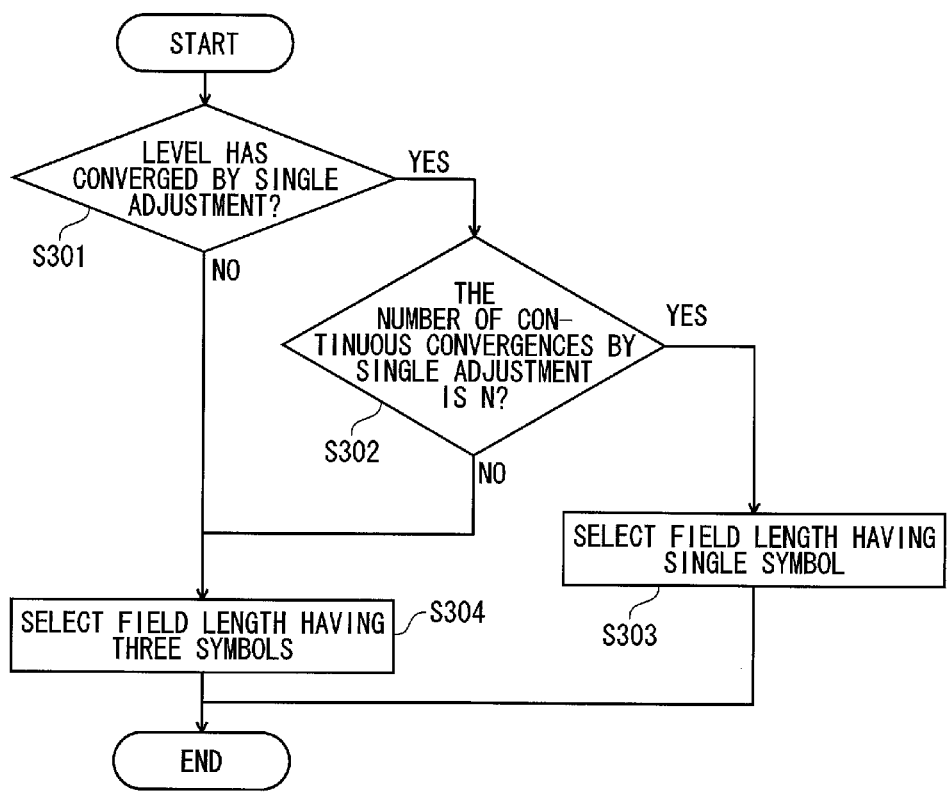
FIG. 11 is a flow chart showing operations of a field length selector.

FIG. 11 is a flow chart showing operations of the field length selector 21 (i.e., details of Step S114 in FIG. 3) when the frame shown in either FIG. 7 or FIG. 8 (or shown in either FIG. 9 or FIG. 10) is used. First, the field length selector 21 determines whether or not the measured level has converged to the target level by a single level adjustment (at Step S301). When the measured level has converged to the target level by the single level adjustment ("Yes" at Step S301), the field length selector 21 determines whether or not the number of continuous convergences by the single level adjustment is equal to or higher than the number N (at Step S302). When the number of continuous convergences by the single level adjustment is equal to or higher than the number N ("Yes" at Step S302), the field length selector 21 selects the frame (FIG. 8 or FIG. 10) having a single AGC field (at Step S303). When the number of continuous convergences by the single level adjustment is not equal to or higher than the number N ("No" at Step S302), the field length selector 21 selects the frame (FIG. 7 or FIG. 9) having three AGC fields (at Step S304). When the measured level has not converged to the target level by the single level adjustment ("No" at Step S301), the field length selector 21 selects the frame having three AGC fields (at Step S304).

As described above, the stability of a transmission status is confirmed and then the AGC field length (time length) is reduced, thus making it possible to prevent an erroneous judgment on the optimal AGC field length. An increase in the precision of a judgment on switching to "short AGC field" is enabled, and an improvement in throughput is enabled. When a surrounding situation is changed and the reception signal level is varied, "long AGC field" can be immediately selected and fed back to the transmitting side communication apparatus. Hence, the reception level of a next packet to be received can be adjusted so as to be an optimal value by using the "long AGC field", thereby making it possible to prevent a frame reception error.

Variation 4

In Variation 3 of the first embodiment, the field length selector 21 may further perform operations in consideration of whether or not an error is detected from a received frame. In Variation 4 of the first embodiment, when an error is detected by a frame error detection process performed between the demodulation process (at Step S112 of FIG. 3) and the frame analysis (at Step S113 of FIG. 3), the field length selector 21 selects a frame having three AGC fields irrespective of the number of level adjustments required for convergence to the target level, the number of continuous convergences, and the like (at Step S304). An error check process is, for example, error check performed by using a CRC code.

As described above, the AGC field length is selected also in consideration of whether or not an error is detected in the received frame, thereby allowing a more suitable judgment to be made, and making it possible to prevent a frame error.

Variation 5

In Variation 3 or Variation 4 of the first embodiment, the field length selector 21 may further perform operations in consideration of retransmission.

Figure 12:
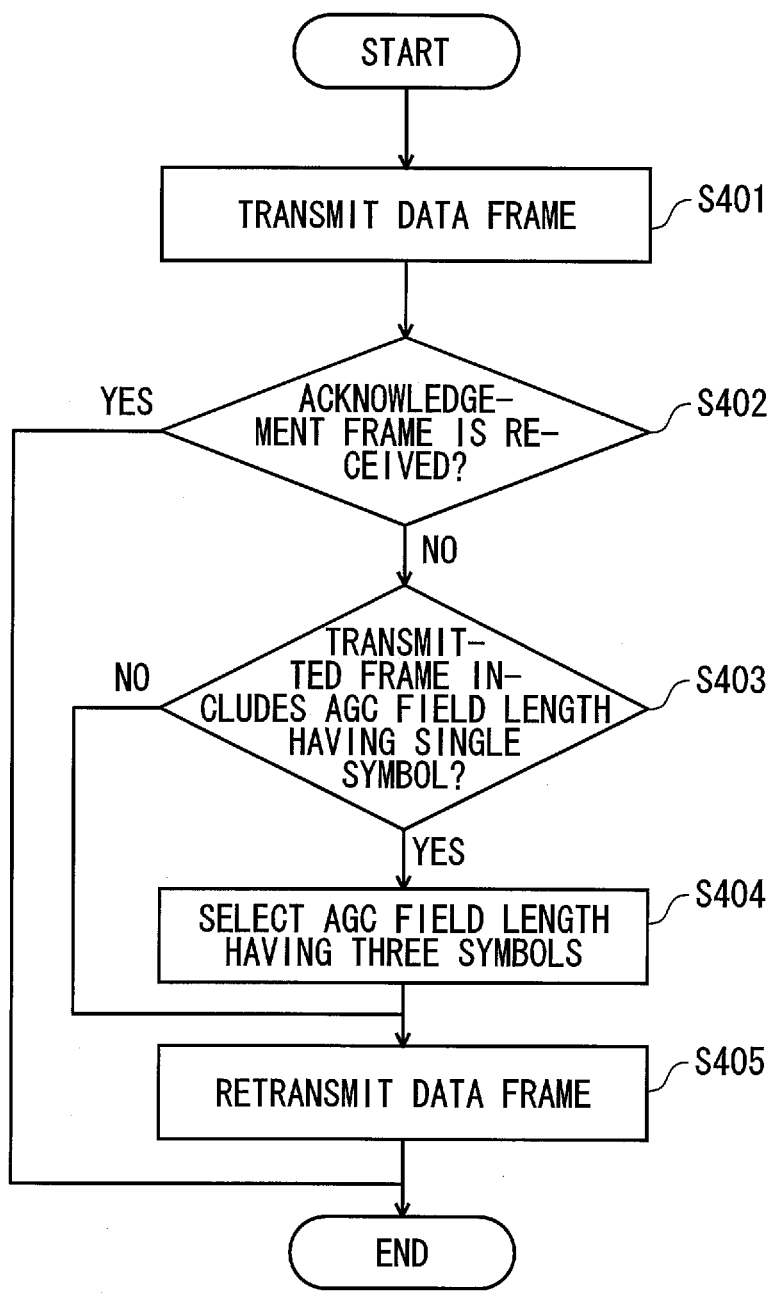
FIG. 12 is a flow chart showing operations of a communication apparatus.

FIG. 12 is a flow chart showing operations of the communication apparatus 2 when the frame shown in either FIG. 7 or FIG. 8 (or shown in either FIG. 9 or FIG. 10) is used. The communication apparatus 2 transmits a data frame to the communication apparatus 1 (at Step S401). When an acknowledgement frame (e.g., ACK or Block Ack) is received ("Yes" at Step S402) after a lapse of a given period of time (SIFS: Short Inter Frame Space), the field length selector 21 does not change the AGC field length.

When no acknowledgement frame is received after a lapse of the given period of time ("No" at Step S402) and the transmitted data frame includes a single AGC field, i.e., a single symbol ("Yes" at Step S403), the field length selector 21 selects the AGC field length "three (three symbols)" shown in FIG. 7 or FIG. 9 (at Step S404). When no acknowledgement frame is received after a lapse of the given period of time ("No" at Step S402) and the data frame includes three AGC fields, i.e., three symbols ("No" at Step S403), the AGC field length selected by the field length selector 21 remains at three AGC fields (i.e., three symbols) shown in FIG. 7 or FIG. 9. Then, the communication apparatus 2 retransmits the data frame having three AGC fields, i.e., three symbols (at Step S405).

As described above, when no acknowledgement frame can be received after a lapse of the given period of time, there is a possibility that the level adjusted by AGC has not fallen within the range of the target level, thus causing the receiving side communication apparatus 1 to fail to receive the data frame; hence, the data frame having AGC fields with a long time length (e.g., three symbols) is retransmitted, thereby making it possible to increase a data frame reception success rate.

Figure 13:
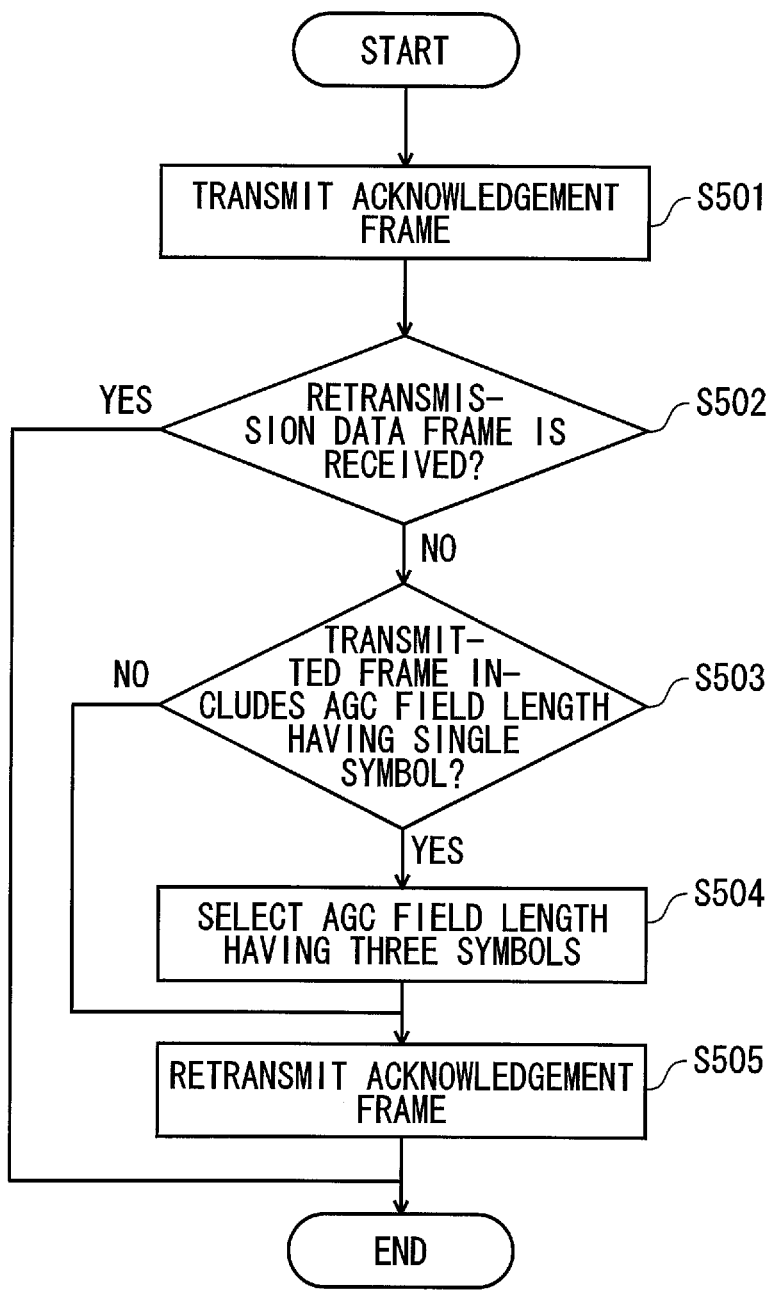
FIG. 13 is a flow chart showing operations of a communication apparatus.

FIG. 13 is a flow chart showing operations of the communication apparatus 1 when the frame shown in either FIG. 7 or FIG. 8 (or shown in either FIG. 9 or FIG. 10) is used. The communication apparatus 1 transmits an acknowledgement frame (e.g., ACK or Block Ack) to the communication apparatus 2 (at Step S501). When a retransmission data frame (i.e., a data frame for which a reception error notification has been provided by the acknowledgement frame) is received ("Yes" at Step S502) after a lapse of a given period of time (SIFS), the field length selector 21 does not change the AGC field length.

When no retransmission data frame is received after a lapse of the given period of time ("No" at Step S502) and the acknowledgement frame includes a single AGC field, i.e., a single symbol ("Yes" at Step S503), the field length selector 21 selects the AGC field length "three (three symbols)" (at Step S504). When no retransmission data frame is received after a lapse of the given period of time ("No" at Step S502) and the acknowledgement frame includes three AGC fields, i.e., three symbols ("No" at Step S503), the AGC field length selected by the field length selector 21 remains at three AGC fields (i.e., three symbols). Then, the communication apparatus 1 retransmits the acknowledgement frame having three AGC fields, i.e., three symbols (at Step S505).

As described above, when no retransmission data frame can be received after a lapse of the given period of time, there is a possibility that the level adjusted by AGC has not fallen within the range of the target level, thus causing the receiving side communication apparatus 2 to fail to receive the acknowledgement frame; hence, the acknowledgement frame having AGC fields with a long time length (e.g., three symbols) is retransmitted, thereby making it possible to reliably carry out acknowledgement.

The given period of time is, for example, Initiator Inter Frame Space (IIFS), Responder Inter Frame Space (RIFS), or a time period in which a given time is added to IIFS or RIFS.

Variation 6

In the foregoing first embodiment or variations thereof, for example, the field length selector 21 may further perform operations in consideration of whether or not a given period of time or more has elapsed from a time point at which communication of an immediately previously received or transmitted frame has been completed. In Variation 6 of the first embodiment, the field length selector 21 can obtain, from a timer (not shown), the time elapsed from a time point at which communication of an immediately previously received or transmitted frame has been completed.

When a given period of time or more has elapsed from the time point at which the communication of the immediately previously received or transmitted frame has been completed, the field length selector 21 selects AGC fields having a long time length (e.g., three symbols). When the given period of time or more has not elapsed from the time point at which the communication of the immediately previously received or transmitted frame has been completed, the field length selector 21 selects an AGC field having a short time length (e.g., a single symbol).

The given period of time is, for example, Initiator Inter Frame Space (IIFS), Responder Inter Frame Space (RIFS), or a time period in which a given time is added to IIFS or RIFS.

IIFS is a time period (carrier sense period) in which the communication apparatus, which has started communication, confirms that a communication medium is Idle before frame transmission. RIFS is a time period (carrier sense period) in which the communication apparatus, serving as a communication partner with which another communication apparatus has started to communicate, confirms that a communication medium is Idle before frame transmission. When a time period between reception of a data frame and transmission of an acknowledgement frame is SIFS, IIFS is greater than SIFS, and RIFS is greater than IIFS.

As described above, the AGC field length is selected in accordance with the time elapsed from the immediately previous frame exchange; thus, since there is a possibility that a surrounding situation is changed and the reception signal level is varied after a long frame transmission interval, the AGC field length having a long time length is selected, thereby allowing the reception signal to be adjusted so as to be at an appropriate level.

Variation 7

Figure 14:
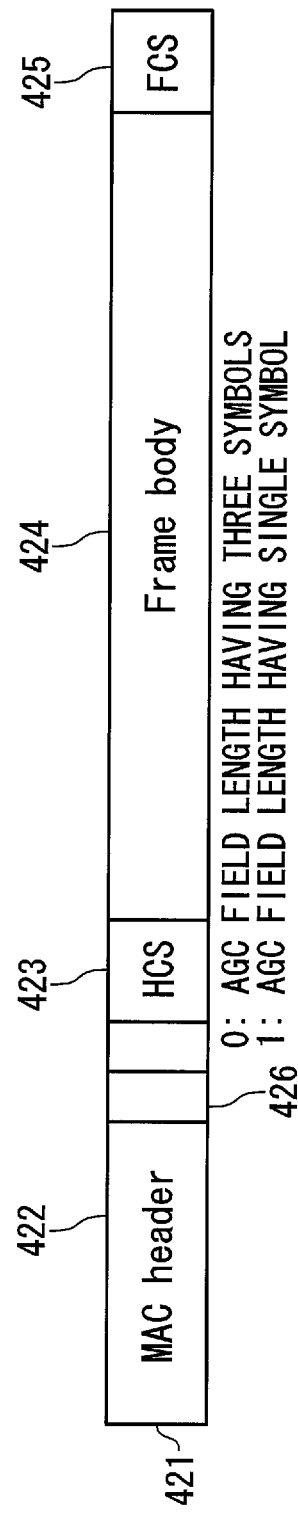
FIG. 14 is a diagram showing a data frame.

FIG. 14 is a diagram showing an example of a frame format of a data frame. A data frame 421 includes: a MAC header 422; a header check sequence (HCS) 423 for detection of an error in the MAC header 422; a frame body 424 in which data and the like are provided; and a frame check sequence (FCS) 425 for detection of an error in the frame body 424. The MAC header 422 has a field indicative of AGC field length information. When the field indicative of AGC field length information is 1 bit, for example, the field value "0" indicates the AGC field length "three (three symbols)", and the field value "1" indicates the AGC field length "single (single symbol)".

Figure 15:
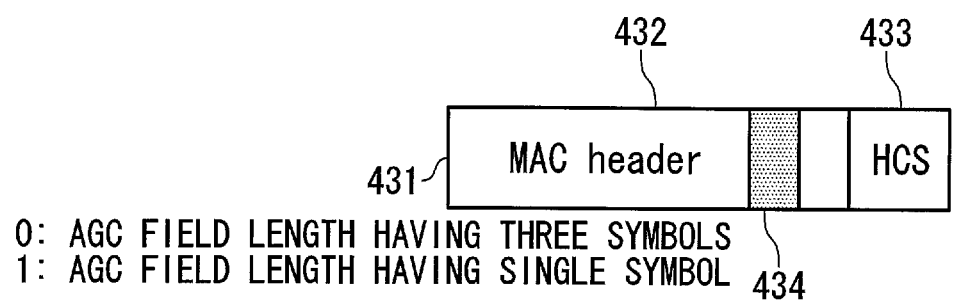
FIG. 15 is a diagram showing an acknowledgement frame.

FIG. 15 is a diagram showing an example of a frame format of an acknowledgement frame (ACK frame). An ACK frame 431 includes a MAC header 432 and a header check sequence (HCS) 433. The MAC header 432 has a field indicative of AGC field length information. When no ACK frame can be received after a lapse of a given period of time, the receiving side communication apparatus retransmits a data frame.

Other Embodiments

While certain exemplary embodiment has been described, the exemplary embodiment has been presented by way of example only, and is not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A communication apparatus for receiving a frame having a plurality of fields for power adjustment, the apparatus comprising:
a measurement module which measures a reception power of each of the plurality of fields;
a determination module which determines whether or not the reception power measured by the measurement module is within a range;
a calculator which calculates a gain using the reception power if the reception power is not within the range;
an adjuster which adjusts a field according to one of an initial gain and the calculated gain;
a selector which selects an AGC field length for a communication frame based on a number of field adjustments made by the adjuster during a period between a start of reception of the frame and a determination by the determination module that the reception power has been within the range; and
a transmitter which transmits information regarding the AGC field length;
wherein:
when the number of field adjustments is lower than a first threshold value, the selector selects, as the AGC field length, a first value; and
when the number of field adjustments is equal to or higher than the first threshold value, the selector selects, as the AGC field length, a second value that is higher than the first value.

2. The apparatus of claim 1, further comprising:
a timer which measures a frame reception interval; and
a counter which counts a number of times that the number of field adjustments made on each of a plurality of frames continuously has a same value, when the plurality of frames whose reception interval is equal to or less than a second threshold value are received,
wherein the selector selects the AGC field length according to the number of field adjustments, when a count result obtained by the counter is equal to or higher than a third threshold value.

3. The apparatus of claim 2, wherein when the number of field adjustments made on each of the plurality of frames, whose reception interval is equal to or less than the second threshold value, is continuously "1" and the count result obtained by the counter is equal to or higher than a fourth threshold value, the selector selects the first value as the AGC field length.

4. The apparatus of claim 2, wherein when the number of field adjustments made on each of the plurality of frames, whose reception interval is equal to or less than the third threshold value, is continuously a value greater than "1" and the count result obtained by the counter is equal to or higher than a fourth threshold value, the selector selects the second value as the AGC field length.

5. The apparatus of claim 2, wherein each of the plurality of frames comprises one of a data frame and an acknowledgement frame including a second field, the second field including the information regarding the AGC field length, and wherein the transmitter transmits the one of the data frame and the acknowledgement frame including the second field.

6. The apparatus of claim 1, further comprising an antenna, wherein the transmitter transmits the information regarding the AGC field length selected by the selector using the antenna.

* * * * *